United States Patent [19]
Stanton et al.

[11] Patent Number: 5,631,721
[45] Date of Patent: May 20, 1997

[54] HYBRID ILLUMINATION SYSTEM FOR USE IN PHOTOLITHOGRAPHY

[75] Inventors: Stuart Stanton, Bridgewater, N.J.;
Gregg Gallatin, Newtown, Conn.;
Mark Oskotsky, Marmaroneck, N.Y.;
Frits Zernike, Norwalk, Conn.

[73] Assignee: SVG Lithography Systems, Inc., Wilton, Conn.

[21] Appl. No.: 449,301

[22] Filed: May 24, 1995

[51] Int. Cl.⁶ .................. G03B 27/72; F21V 9/04; G02B 5/18
[52] U.S. Cl. .................. 355/71; 362/268; 359/569
[58] Field of Search .................. 355/67, 71; 362/268; 359/569, 575, 857; 3462/291, 293

[56] References Cited

U.S. PATENT DOCUMENTS

| | | | |
|---|---|---|---|
| 3,904,295 | 9/1975 | Hock et al. | 356/167 |
| 4,497,013 | 1/1985 | Ohta | 362/32 |
| 4,516,832 | 5/1985 | Jain et al. | 350/96.24 |
| 4,619,508 | 10/1986 | Shibuya et al. | 353/122 |
| 4,918,583 | 4/1990 | Kudo et al. | 362/268 |
| 4,939,630 | 7/1990 | Kikuchi et al. | 362/268 |
| 5,191,474 | 3/1993 | Suzuki et al. | 359/668 |
| 5,237,367 | 8/1993 | Kudo | 355/67 |
| 5,245,384 | 9/1993 | Mori | 355/67 |
| 5,296,892 | 3/1994 | Mori | 355/67 |
| 5,300,971 | 4/1994 | Kudo | 355/67 |
| 5,309,198 | 5/1994 | Nakagawa | 355/67 |
| 5,320,918 | 6/1994 | Raab et al. | 430/4 |
| 5,329,336 | 7/1994 | Hirano et al. | 355/53 |
| 5,357,312 | 10/1994 | Tounai | 355/67 |
| 5,359,388 | 10/1994 | Hollman | 355/71 X |
| 5,367,358 | 11/1994 | Kamon | 355/71 |
| 5,446,587 | 8/1995 | Kang et al. | 355/53 |

FOREIGN PATENT DOCUMENTS

0486316A2   5/1992   European Pat. Off.

*Primary Examiner*—Arthur T. Grimley
*Assistant Examiner*—David A. Lane
*Attorney, Agent, or Firm*—Fattibene and Fattibene; Paul A. Fattibene; Arthur T. Fattibene

[57] ABSTRACT

An illumination system for use in photolithography having an array optical element near the formation of a desired illumination field. Light or electromagnetic radiation from an illumination source is expanded and received by a multi-image optical element forming a plurality of secondary illumination sources in a plane. A condenser receives the light from the plurality of illumination sources. A array or diffractive optical element is placed on or near the focal point of the condenser. The illumination plane formed at the focal point of the condenser is within the near field diffraction pattern of the array or diffractive optical element. There is no condenser following the array or diffractive optical element. The use of the array or diffractive optical element permits the use of a condenser between the multi-image optical element and the array or diffractive optical element having a smaller numerical aperture than the emergent numerical aperture of the diffractive optical element, and generates a desired angular distribution with little dependance on the illumination source profile.

47 Claims, 6 Drawing Sheets

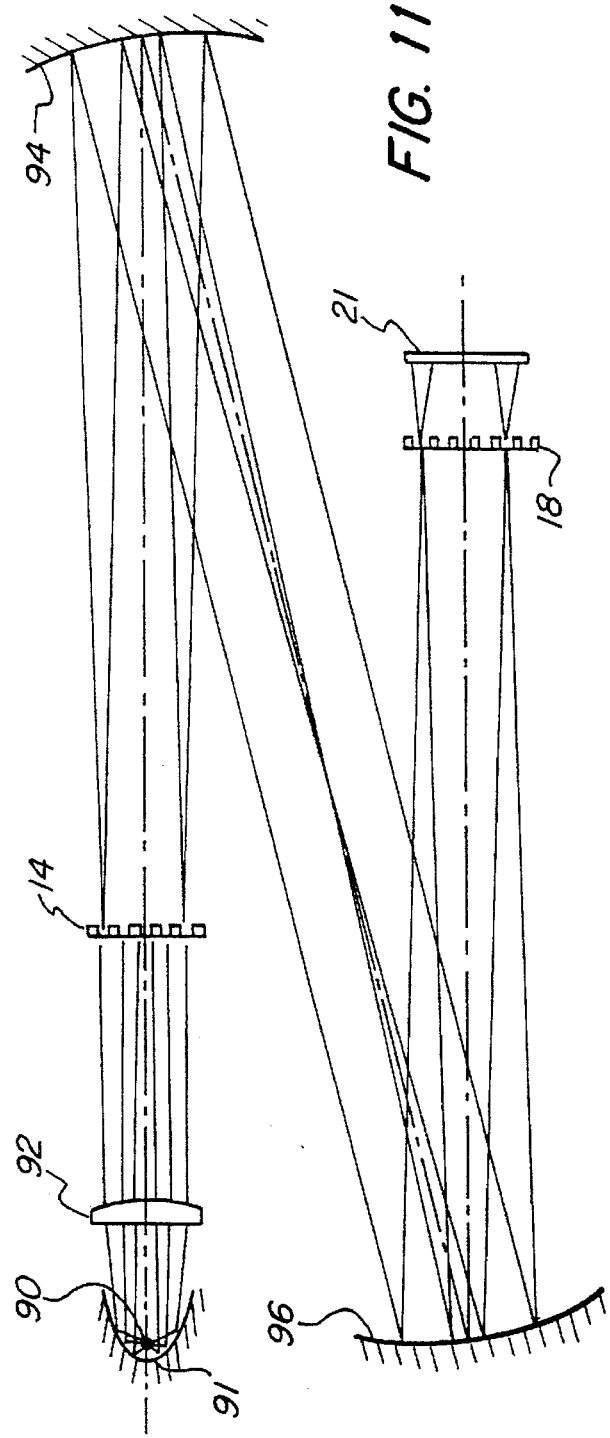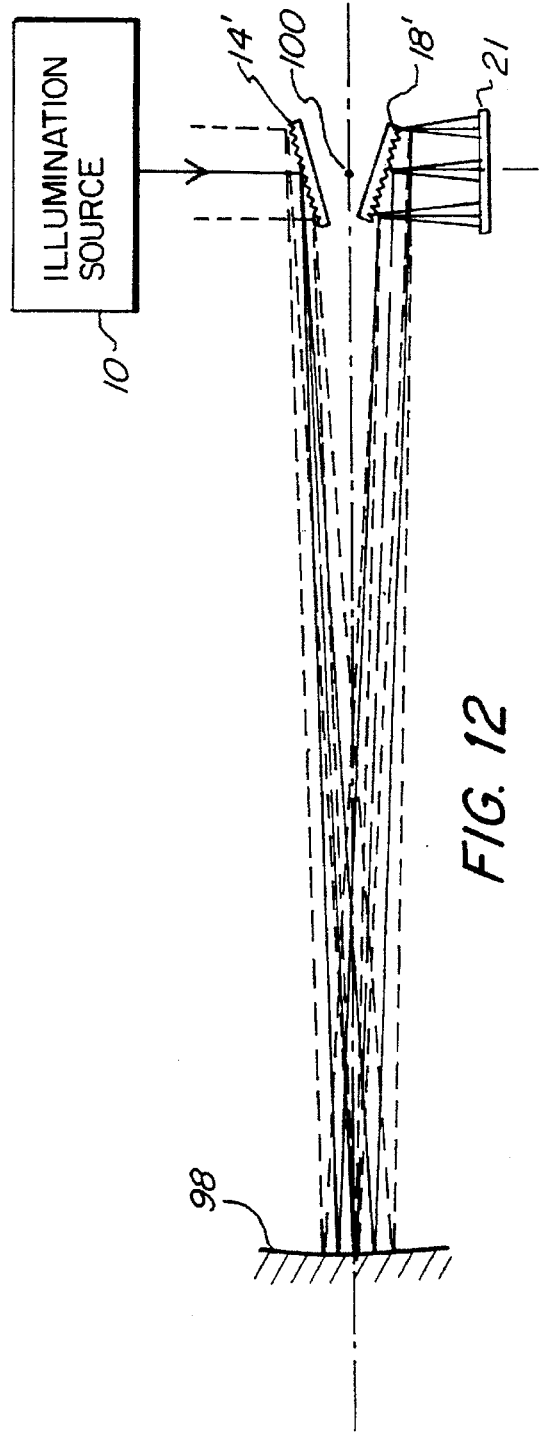

HYBRID ILLUMINATION SYSTEM FOR USE IN PHOTOLITHOGRAPHY

FIELD OF THE INVENTION

The present invention relates generally to an illumination system used in photolithography for the manufacture of semiconductor devices, and more particularly to an illumination system using both refractive and diffractive optical elements.

BACKGROUND OF THE INVENTION

In the manufacture of semiconductor devices photolithography techniques are used to reproduce the image of a reticle onto a photosensitive resist covered semiconductor wafer. The reticle contains circuit patterns that are imaged onto the photosensitive resist covered wafer. After a series of exposures and subsequent processing, a semiconductor device containing a circuit pattern thereon is manufactured. An illumination system is used to provide electromagnetic radiation for projecting the image of a reticle onto a semiconductor wafer. The image of the reticle is formed by an optical projection system that collects the electromagnetic radiation after passing through the reticle and projects the image of the reticle onto the photosensitive resist covered semiconductor wafer. As semiconductor device manufacturing technology advances, there are ever increasing demands on each component of the photolithography system used to manufacture the semiconductor devices. This includes the illumination system used to illuminate the reticle. There are many prior illumination systems that enhance uniformity of illumination and minimize loss of light. One such illumination system is disclosed in U.S. Pat. No. 5,300,971 entitled "Projection Exposure Apparatus" issuing to Kudo on Apr. 5, 1994, which is herein incorporated by reference. Therein disclosed is an illumination system having a pulsed light source with a rotating deflecting prism used to direct the pulsed light to a fly's eye lens separated from the optical axis. A condenser is then used to condense the light from the fly's eye lens for illuminating a reticle. Another illumination system is disclosed in U.S. Pat. No. 5,296,892 entitled "Illuminating Apparatus and Projection Exposure Apparatus Provided With Such Illumination Apparatus" issuing to Mori on Mar. 22, 1994, which is herein incorporated by reference. Therein disclosed is an illumination system having an optical integrator or a fly's eye lens positioned before a condenser. The optical integrator or a fly's eye lens is designed to be replaceable so that the numerical aperture on the emission side of the illumination system can be varied. Another illumination system is disclosed in U.S. Pat. No. 5,245,384 entitled "Illuminating Optical Apparatus and Exposure Apparatus Having The Same" issuing to Mori on Sep. 14, 1993, which is herein incorporated by reference. Therein disclosed is an illumination system having an afocal zoom optical system placed before an optical integrator or fly's eye lens to vary the size of a plurality of secondary light sources. Yet another illumination system is disclosed in U.S. Pat. No. 5,237,367 entitled "Illuminating Optical System and Exposure Apparatus Utilizing The Same" issuing to Kudo on Aug. 17, 1993, which is herein incorporated by reference. Therein disclosed is an illumination system having a first optical integrator or fly's eye lens and a first condenser followed by a second optical integrator or fly's eye lens and a second condenser. The second condenser then provides illumination to a reticle. Either the first optical integrator or fly's eye lens and the first condenser have a variable focal length. A further illumination system is disclosed in U.S. Pat. No. 4,939,630 entitled "Illumination Optical Apparatus" issuing to Kikuchi et al on Jul. 3, 1990, which is herein incorporated by reference. Therein disclosed is an illumination system having a first optical integrator or means for forming a plurality of light source images followed by an optical system containing a second optical integrator or tertiary light source forming means followed by a condenser which directs illumination onto a reticle.

While many of these prior illumination systems have provided improved illumination for their particular application and have provided some degree of flexibility in their adaptability to systems having different projection optics in which they are used, there is still a need to provide an illumination system that can be easily manufactured and provides a uniform illumination of a desired profile or illumination pattern with low loss that also has a large numerical aperture near the reticle.

SUMMARY OF THE INVENTION

The present invention is a hybrid optical illumination system that uses both refractive and diffractive optical elements. Accordingly, the apparatus of the present invention comprises an illumination source generating a beam of electromagnetic radiation, a beam conditioner following the illumination source and receiving the electromagnetic radiation therefrom, a multi-image optical element receiving electromagnetic radiation from the beam conditioner and forming a plurality of illumination sources in a plane, a condenser following the multi-image optical element and receiving electromagnetic radiation therefrom, and an array optical element following the condenser and receiving electromagnetic radiation therefrom. The array optical element forming a plane of illumination having predetermined characteristics, including a predetermined angular distribution, that are used to illuminate a reticle for projection of the reticle image through projection optics onto a substrate, such as a semiconductor wafer containing a photosensitive resist. The array optical element increases divergence with controlled spatial change. The predetermined angular distribution may be in the form of conventional top hat illumination, annular illumination or quadrupole illumination.

In one embodiment, the multi-image optical element is a micro lens array. In another embodiment the multi-image element is a diffractive optical element that has desirable imaging characteristics in the far field or Fraunhofer diffraction region. In another embodiment the array optical element is a diffractive optical element. In another embodiment of the present invention, a relay is used to conjugate the illumination plane formed by the array optical element to a reticle. In another embodiment of the present invention a rectangular slit illumination plane is divided into illumination along an X axis and illumination along a Y axis that are spatially separated by an anamorphic condenser and conjugated to a single illumination plane with an astigmatic relay. In another embodiment of the present invention, a multiplexing beam conditioner is used to manipulate the coherence of the beam of electromagnetic radiation incident on the multi-image optical element. In another embodiment of the present invention, a non-beam like source is used with a pair of concave mirrors placed between a first array and a second array optical element. In yet another embodiment of the present invention, all reflective elements are used.

Accordingly, it is an object of the present invention to provide improved illumination of a reticle as used in photolithography.

It is a further object of the present invention to control the exit or emergent numerical aperture of an illumination system, and the detailed angular distribution of radiation.

It is an advantage of the present invention that a condenser used in the present invention can have a smaller numerical aperture than the numerical aperture of the radiation at the reticle.

It is a further advantage of the present invention that desirable illumination field properties are obtained with low loss of light.

It is yet a further advantage of the present invention that when a partially coherent illumination source is used, undesirable speckle is reduced.

It is a feature of the present invention that a diffractive optical element is used to form an illumination field that is used to illuminate a reticle.

These and other objects, advantages, and features will become more readily apparent in view of the following detailed description.

BRIEF DESCRIPTION OF THE DRAWINGS

FIG. 11 is a schematic illustration of another embodiment of the present invention where the source is non-beam like.

FIG. 12 is a schematic illustration of another embodiment of the present invention that is all reflective.

DETAILED DESCRIPTION OF THE PREFERRED EMBODIMENTS

Figure 1:
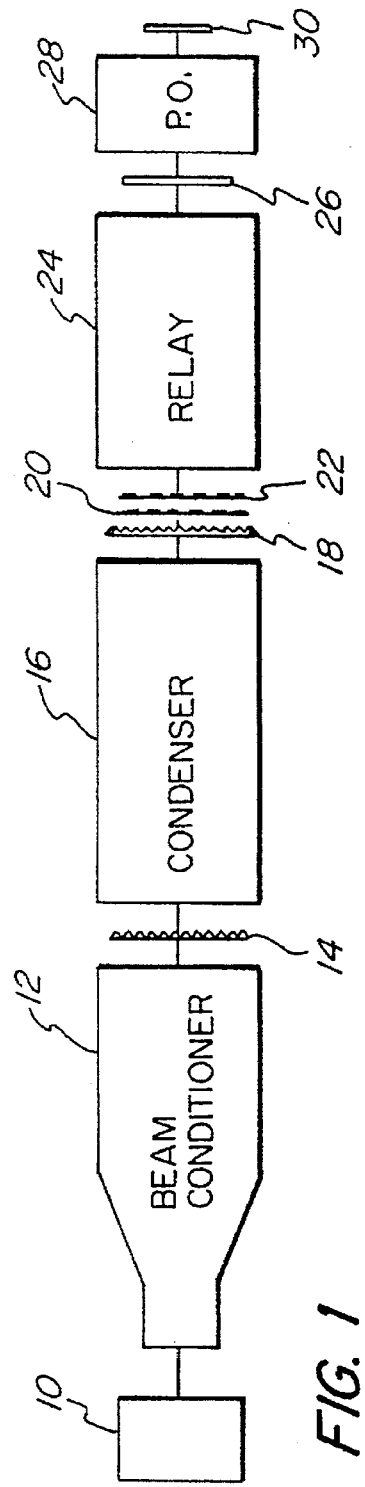
FIG. 1 is a block diagram illustrating an embodiment of the present invention applied to projection lithography.

FIG. 1 illustrates one embodiment of the present invention. An illumination source 10 directs electromagnetic radiation into a beam conditioner 12. The term illumination source is used in its broadest sense to mean any electromagnetic radiation source regardless of wavelength. Therefore, the illumination source 10 may be a laser having a wavelength that is not in the visible region. Additionally, the illumination source may be a pulsed laser or a continuous wave laser. The beam conditioner 12 enlarges or modifies the beam of electromagnetic radiation from the illumination source 10. This may be accomplished by a beam expander such as a refractive optical system, or a reflective optical system. The conditioned electromagnetic radiation is directed through a multi-image optical element 14. The multi-image optical element 14 may be a microlens array comprised of a plurality of refractive lens elements or a diffractive optical element. If a diffractive optical element is used, the diffractive optical element is designed to provide uniform radiation in the far field or in the Fraunhofer diffractive region. Multi-image optical element 14 directs light to a condenser 16. For a scanning photolithography system, the condenser 16 is preferably an anamorphic condenser in that a rectangular slit illumination field is formed thereby. The condenser 16 collects light from the multi-image optical element 14 and directs it to an array optical element 18.

The array optical element 18 is a two dimensional periodic and/or quasi-periodic array of micro optical elements which use diffraction and/or refraction to control wave fronts. The array optical elements may include binary optics, diffraction gratings, surface relief diffractive elements, Fresnel lenses, holographic optical elements and other designs that rely on diffraction for their primary optical properties and/or may use refraction as in a conventional optical element. The array optical element 18 is any element which uses substrates or elements of transmissive or reflective materials having amplitude and/or phase modulation or patterns which generate distinct amplitude, phase, and intensity patterns at specified fields or spatial positions. The preferred embodiment of the present invention uses transmission elements, but reflective elements of the same nature are feasible. Similarly, a diffusive optical element is defined as any optical element whose effect on a substantially directional or beam-like electromagnetic radiation field is to reduce it's directional nature to some degree by generating the effect of a large number of apparent secondary electromagnetic radiation sources. Therefore, a diffusive optical element is a type of diffractive optical element.

A supplier of suitable diffractive optical elements is Teledyne Brown Engineering of Huntsville, Ala. The array optical element 18 efficiently generates desirable angular fills or distributions of electromagnetic radiation at the reticle for different photolithographic imaging situations. This is known as the pupil fill. The pupil fill or angular distribution of electromagnetic radiation may be of the form of top hat illumination, annular illumination or quadrupole illumination. By top hat illumination it is meant that at any single point at the reticle, when looking back towards the source, a uniform circular illumination pattern is seen. Therefore, a plurality of uniform circular illumination patterns is used to illuminate the reticle. By annular illumination it is meant that at any single point at the reticle an annular or ring shaped illumination pattern is seen. Therefore, a plurality of annular illumination patterns is used to illuminate the reticle. By quadrupole illumination it is meant that at any single point at the reticle four separate circular illumination patterns are seen. Therefore, a plurality of quadrupole illumination patterns is used to illuminate the reticle. The array optical element 18 design can be accomplished with conventional physical optics modeling or an optimization approach based on iteration of parameters in an electromagnetic model. If a diffractive optical element is used, the design can be accomplished with conventional diffraction modeling or an optimization approach based on iteration of parameters in the diffraction model.

In this embodiment, spatially separate X and Y illumination planes are formed. Accordingly, a Y illumination plane 20 and an X illumination plane 22 are formed. While the X and Y illumination planes 20 and 22 are illustrated as being spatially separate, the illuminating system may be designed so that the Y and X illumination planes 20 and 22 are not spatially separate. Relay 24 is used simply to conjugate the Y and X illumination planes 20 and 22 to a reticle 26. Because the Y and X illumination planes 20 and 22 are spatially separate, in this embodiment, the relay is an astigmatic relay. The illumination formed at reticle 26 has very desirable properties, such as having a large exit or emergent numerical aperture, controlled pupil fill, and being telecentric to the required degree of accuracy. Accordingly, the illumination of reticle 26, which contains the image of a circuit pattern to be formed on a wafer 30 by projection optics 28, is greatly enhanced.

Figure 2:
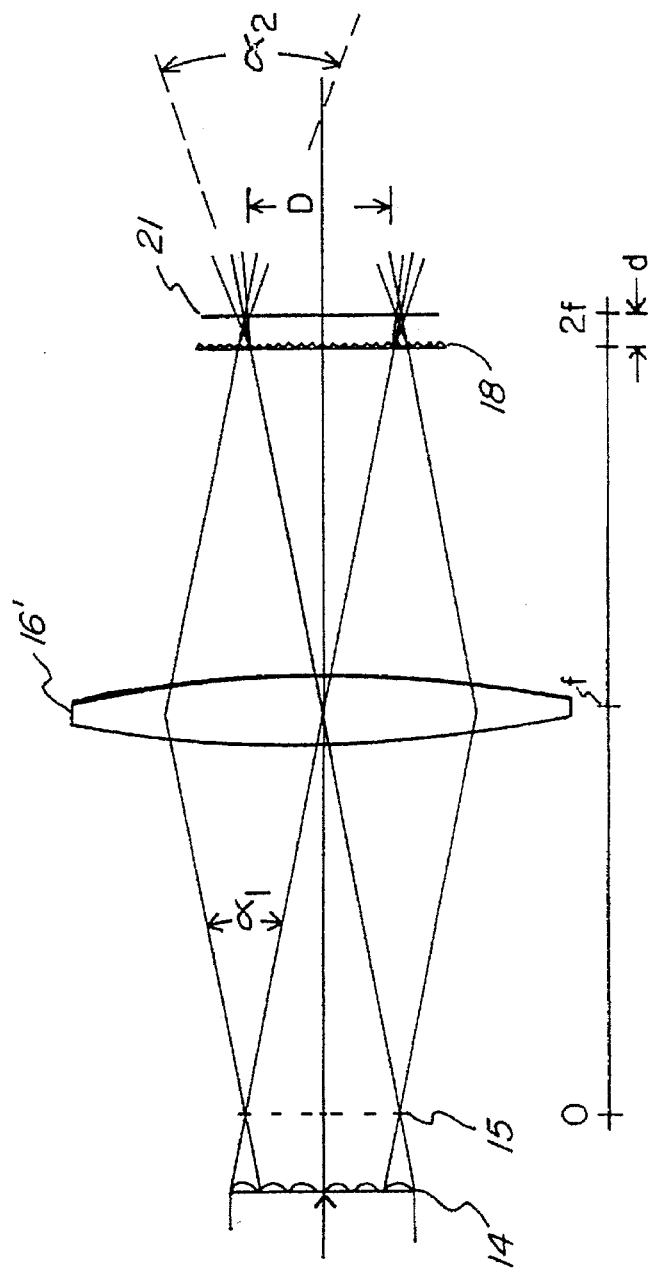
FIG. 2 is a schematic representation of a portion of the present invention.

FIG. 2 illustrates an important benefit of the present invention. The multi-image optical element 14 forms a plurality of illumination source images at its focal plane 15. A condenser, schematically illustrated at 16', provides the Fraunhofer pattern of element 14 at illumination plane 21. The condenser 16' has a focal length f. A first numerical aperture $\propto_1$ is formed on the illumination or entrance side of the condenser 16'. A second numerical aperture $\propto_2$ is formed on the exit or emergent side of the array optical element 18 near where the illumination plane 21 is formed. The second numerical aperture $\propto_2$ is larger than the first numerical aperture $\propto_1$. The second numerical aperture $\propto_2$ is used to create the desired pupil fill as required by the projection optics used to image a reticle onto a wafer. The illumination plane 21 has an effective height D. The array optical element 18 is distinct from the multi-image optical element 14 because it forms an illumination plane 21 in the near field or in the Fresnel diffraction region. The reticle or its conjugate is placed within the illumination plane 21. In the present invention a condenser is not placed between the array optical element 18 and the illumination plane 21. The array optical element 18 is placed a distance d from the illumination plane 21 located at the exit, emergent, or reticle side of the illumination system near the focal plane of condenser 16'. Distance d should be much less than the focal length of condenser 16'. Accordingly, with the use of the array optical element 18 the first numerical aperture $\propto_1$ can be made much less than the second numerical aperture $\propto_2$. This permits flexibility and reduced cost in the condenser design. Additionally, the performance of the illumination system can be varied by designing the array optical element 18 with a different second numerical aperture $\propto_2$ and by varying distance d. In this way, optimized pupil fills can be obtained for different reticle features or projection optics. This can be accomplished easily, relatively inexpensively, and with small loss of electromagnetic radiation energy.

Figure 3:
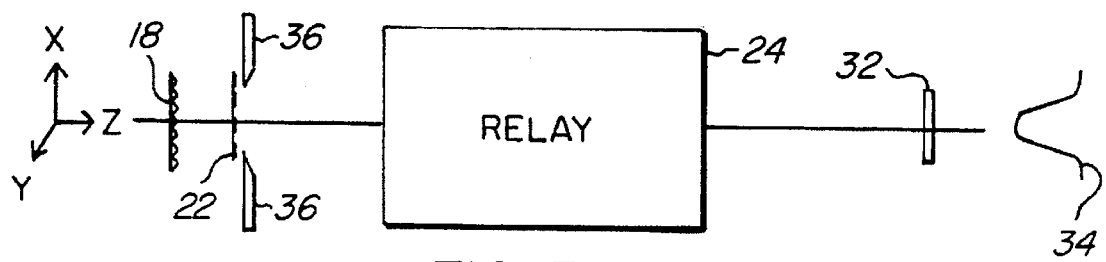
FIG. 3 is a schematic representation of the formation of a predetermined illumination profile along an X axis.

FIG. 3 illustrates a portion of the illumination system illustrated in FIG. 1. FIG. 3 more clearly illustrates a feature of the embodiment illustrated in FIG. 1. In FIG. 3, the X or horizontal axis of the illumination system is illustrated. The array optical element 18 results in the X axis illumination plane 22 to be formed near or at a horizontal or X axis delimiter 36. The function of the delimiter 36 is to more clearly define the edges of the X axis illumination plane 22 and to remove any stray electromagnetic radiation. Relay 24 conjugates the X axis illumination plane 22 to the horizontal or X axis opening 32 of a slit. As a result an illumination intensity profile 34 is formed. The illumination intensity profile 34 can be optimized for scanning photolithography. The illumination intensity profile 34 represents the illumination intensity along the horizontal or x axis.

Figure 4:
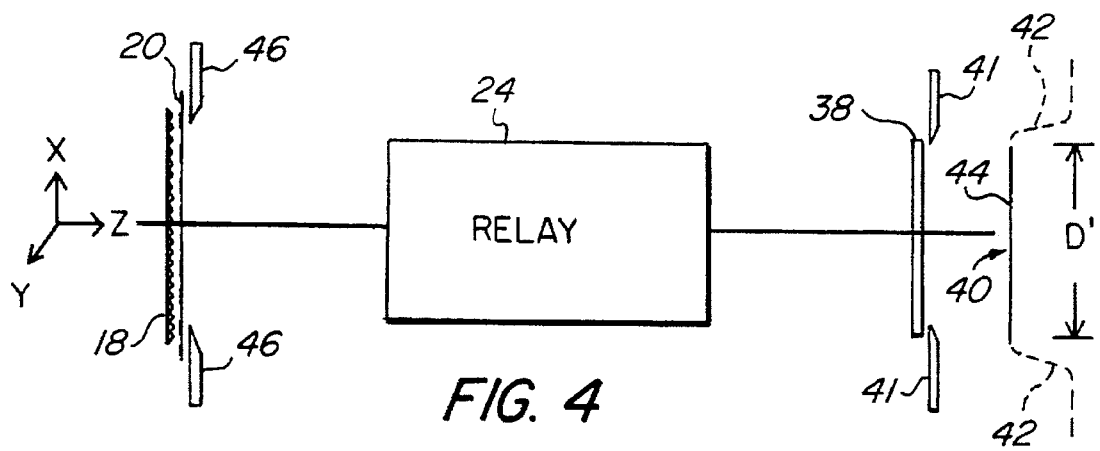
FIG. 4 is a schematic representation of the formation of a predetermined illumination profile along a Y axis.

FIG. 4 is similar to FIG. 3. However, FIG. 4 illustrates the vertical or Y axis of a portion of the illumination system illustrated in FIG. 1. Array optical element 18 causes a Y axis illumination plane 20 to be formed at or near vertical or Y axis delimiter 46. The Y axis illumination plane 20 is conjugated by relay 24 to a vertical or Y axis opening 38 of a slit. As a result an illumination intensity profile 40 is formed. The illumination intensity profile 40 represents the illumination intensity along the vertical or Y axis. A portion 42, at the edges of the illumination intensity profile 40, is removed by contour blades 41. Thereby, a Y axis illumination profile having substantially constant illumination intensity over a distance D' is formed. The substantially constant illumination intensity is used in the non-scan axis in scanning photolithography.

Referring to FIGS. 3 and 4, it should be appreciated that an anamorphic condenser, illustrated in FIG. 1, may be used to form X and Y illumination profiles having different dimensions and shapes. Additionally, relay 24 may be astigmatic in order to re-image or conjugate the spatially separate X and Y illumination planes 22 and 20 at the X and Y axis 32 and 38 in a single plane on or near a slit. Additionally, the X and Y axis 32 and 38 of a slit form a rectangular illumination field that has a substantially constant illumination profile along its Y axis or longitudinal length and a trapezoidal illumination profile along its X axis or lateral length. This illumination field is particularly desirable in a scanning photolithography apparatus, and in particular to a step and scan photolithographic apparatus. The trapezoidal illumination profile along the axis parallel to the scan direction improves the uniformity of the exposure dose consistency along the scanned field of the photosensitive resist covered wafer.

Figure 5:
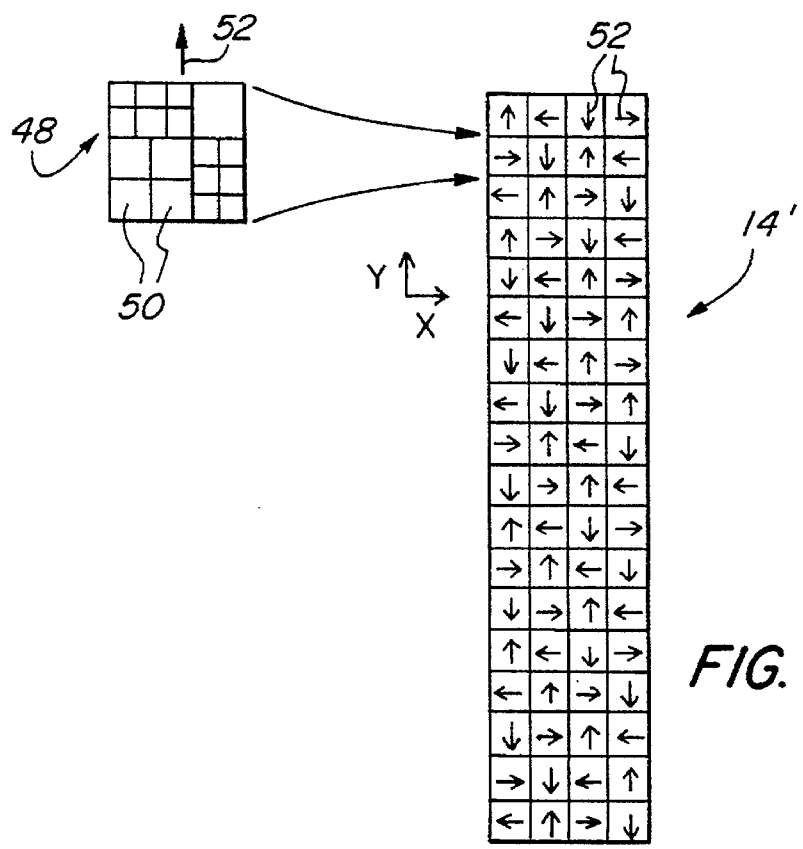
FIG. 5 illustrates a preferred configuration of a multi-image optical element.

FIG. 5 illustrates an optical element 14' which may be used as a multi-image optical element 14 as shown in FIG. 1. The optical element 14' is made up of units 48 forming a 4×18 array. Each of the units 48 is formed of cells 50. The cells 50 are formed in an asymmetrical or random way. Each unit 48 has an orientation represented by arrow 52. Each unit 48 that makes up the array comprising optical element 14' is rotated such that the orientations, represented by arrows 52, are different. This prevents a regular pattern from being formed by the optical element 14'.

Figure 6:
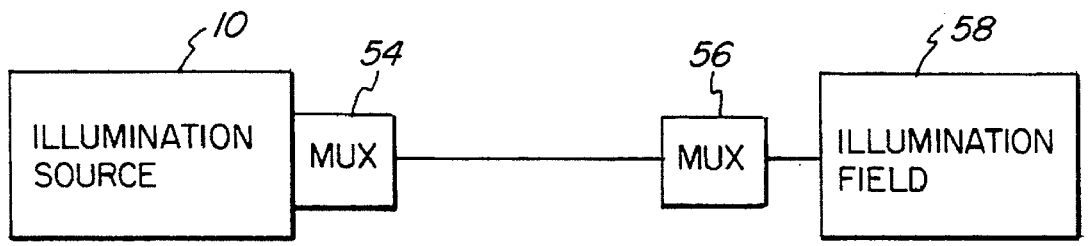
FIG. 6 is a block diagram illustrating the use of illumination source multiplexers.

FIG. 6 illustrates one type of beam conditioner 12 illustrated in FIG. 1. Illumination source 10 directs light into a first multiplexer 54 which in turn directs light into a second multiplexer 56. The first and second multiplexers 54 and 56 cause a bundle of similar beams as an illumination output 58 to be formed. The illumination output 58 is then directed to multi-image optical element 14, as illustrated in FIG. 1.

Figure 7:
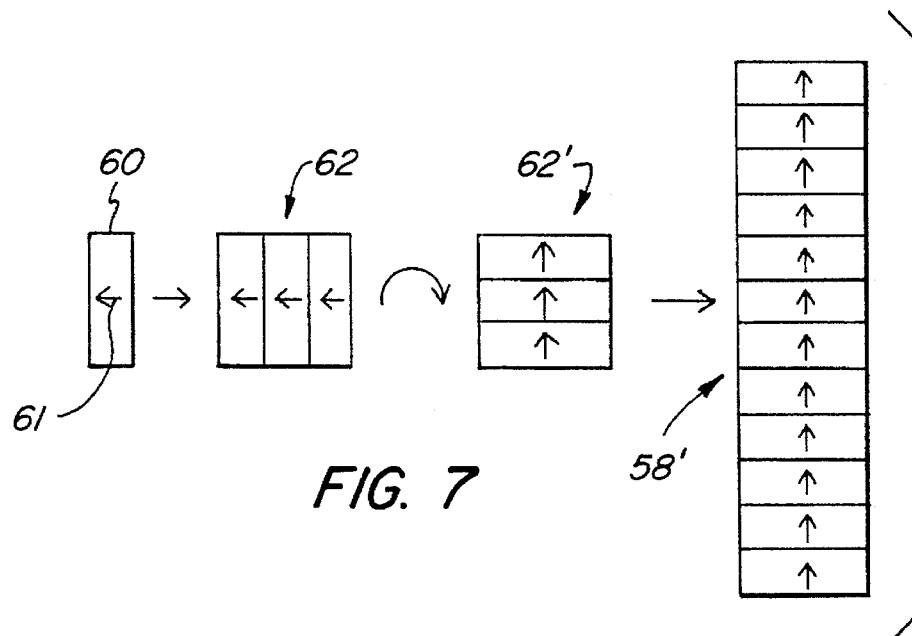
FIG. 7 illustrates the formation of multiple parallel beams for incidence on the multi-image optical element by multiplexing.

In FIG. 7, an aperture or region input illumination 60 from illumination source 10 is illustrated. The input illumination 60 may have an orientation represented by arrows 61, such as when the electromagnetic illumination is polarized. As a result of a first multiplexer 54, illustrated in FIG. 6, intermediate output 62 is formed. Intermediate output 62 is rotated resulting in a rotated intermediate output 62'. This rotated intermediate output 62' is again multiplexed with a second multiplexer 56, illustrated in FIG. 6, to form an output comprising illumination output 58'. The illumination output 58' has an overall rectangular shape. The illumination output 58' is, in this case, a one by twelve array of portions representative of the initial input illumination 60.

Figure 8:
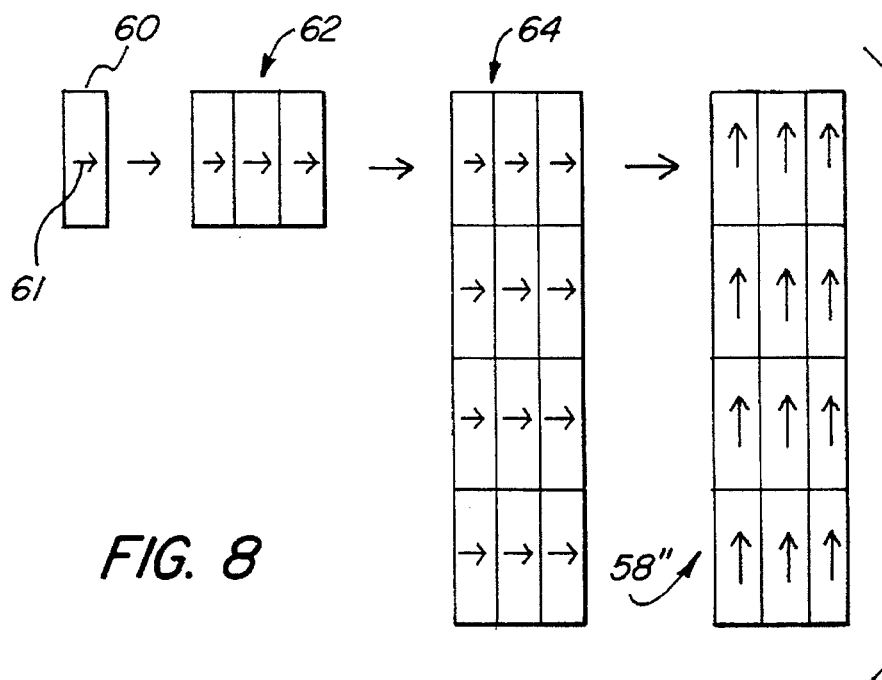
FIG. 8 illustrates another method of forming multiple beams by multiplexing.

FIG. 8 illustrates another technique for obtaining an illumination output 58 using multiplexing. In FIG. 8, an input illumination 60 from illumination source 10, illustrated in FIG. 6, is multiplexed to form an intermediate output 62. The intermediate output 62 is further multiplexed by a second multiplexer 56, illustrated in FIG. 6, to form a second output 64. When a polarized input illumination 60 is used, the orientation of the illumination elements forming intermediate output 64 can then be rotated to form an illumination field 58". For a polarized beam, the orientation can be rotated by a wave plate. The illumination output 58" is, in this case, a three by four array of portions representative of the initial input illumination 60.

The use of multiplexing has many advantages and is used to generate a large number of secondary beams each of which maintain the collimated nature of the illumination source. With multiplexing, the illumination source beam is formed into a useful field size without a proportional expansion of lateral coherence distances. Additionally, the secondary beams or multiplex beams may be longitudinally lagged by a distance larger than the coherence length, making them mutually incoherent. The use of multiplexers has the advantage of being very compact and relatively easy to manufacture, and therefore inexpensive.

Figure 9:
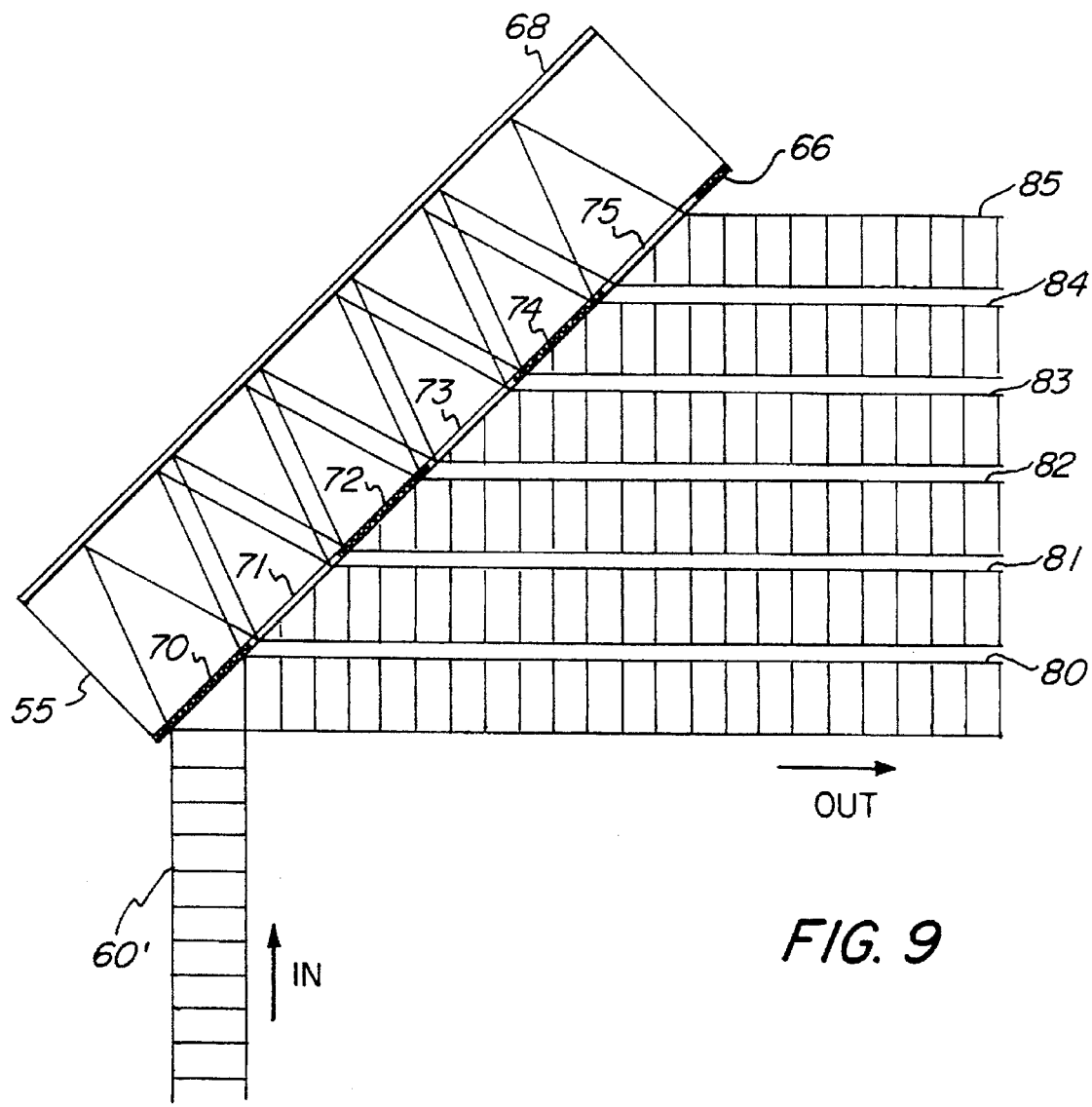
FIG. 9 is a schematic illustration of an apparatus used for multiplexing a beam of electromagnetic radiation from an illumination source.

FIG. 9 illustrates a multiplexer. The multiplexer is formed of a block 55 having two substantially parallel planar surfaces The planar surfaces have several reflective coatings with different reflectivities. Reflective surface 68 has a coating providing the most reflection possible. Surface 66 has a plurality of partially reflective coatings 70, 71, 72, 73, 74, and 75. Each of the partially reflective coatings 70, 71, 72, 73, 74, and 75 have differing degrees of reflectivity with the last coating 75 preferably not reflecting at all. The reflective coatings become less and less reflective while progressing from the first coating 71 to the last coating 75. A portion of input illumination 60' is reflected from surface 70 resulting in a secondary output beam 80. A portion of the input illumination beam 60' is transmitted through block 55 and reflected from reflective surface 68. The reflected portion of input illumination beam 60' is again transmitted through block 55. A portion of the reflected partial input illumination beam 60' is transmitted through partially reflective surface 71 forming a second output beam 81. A portion of the input illumination beam 60' is reflected from partially reflective surface 71, transmitted through block 55, and again reflected off reflective surface 68, transmitted through block 55, and through partially reflective surface 72 forming another secondary output beam 82. The multiplexing of input beam 60' is continued to form a plurality of secondary output beams 80, 81, 83, 84, and 85. These secondary output beams may themselves be made input beams to a second multiplexer, thereby forming a larger array. The use of multiplexers in this way has the advantage of maintaining the original lateral coherence of the source within secondary beams while eliminating undesirable longitudinal coherence between secondary beams. The mutually incoherent secondary beams greatly reduce the phenomenon of speckle as exhibited with illumination systems using coherent illumination sources, and improves the performance of the multi-image optical element 14. Additionally, the multiplexing results in highly efficient transmission with low light loss. Although the hybrid illuminator will function with relatively poor matching of secondary beam powers, preferably, the reflective coatings are set to yield an even power distribution. The following formula or algorithm can be used to optimize the evenness of the power.

$$K = \frac{R_{MAX}(1-r)}{\frac{1}{N} + \left(\frac{(N-1)}{N}\right) R_{MAX}(1-r)}$$

$$R_1 = \frac{K}{N}$$

-continued
for $j = 2,3,4, \ldots N-1$ $$R_j = \frac{1-K}{N\left(1 - (j-1)\frac{K}{N}\right) R_{MAX}}$$

Where,

K is a constant that carries the losses occurring throughout;

N is the number of secondary beams;

$R_{MAX}$ is the rear reflectance at 68 in FIG. 9, including the absorption effect through the block 55 in FIG. 9; and r is an assumed small reflectance at the last coating.

For example in a two stage multiplexer for generating 15 secondary beams, and assuming r=0.005, and RMAX= 0.995, then Stage 1:

N=3
K=0.9967
$R_1$=0.3322
$R_2$=0.5000

Stage 2:
N=5
K=0.9980
$R_1$=0.1996
$R_2$=0.7494
$R_3$=0.6661
$R_4$=0.5000

The energy in each of the fifteen secondary beams is 0.3322 times 0.1996, or 0.06631. Just over 0.5% loss occurs, which is due to the light leaking out of $R_{MAX}$ as it is seen N−1 times by various fractions of the original energy. Thus the optimum coating formulation can be highly efficient. Additionally, the size of the secondary beams, or the gaps between beams is not critical because the profile of the each beam will disappear by convolution through the second array optical element 18, illustrated in FIG. 1 and 2. The usefulness of balanced power in the secondary beams is that it provides similar weight to multiple sources at multi-image optical element 14, such that the most efficient averaging occurs at array element 18.

Figure 10:
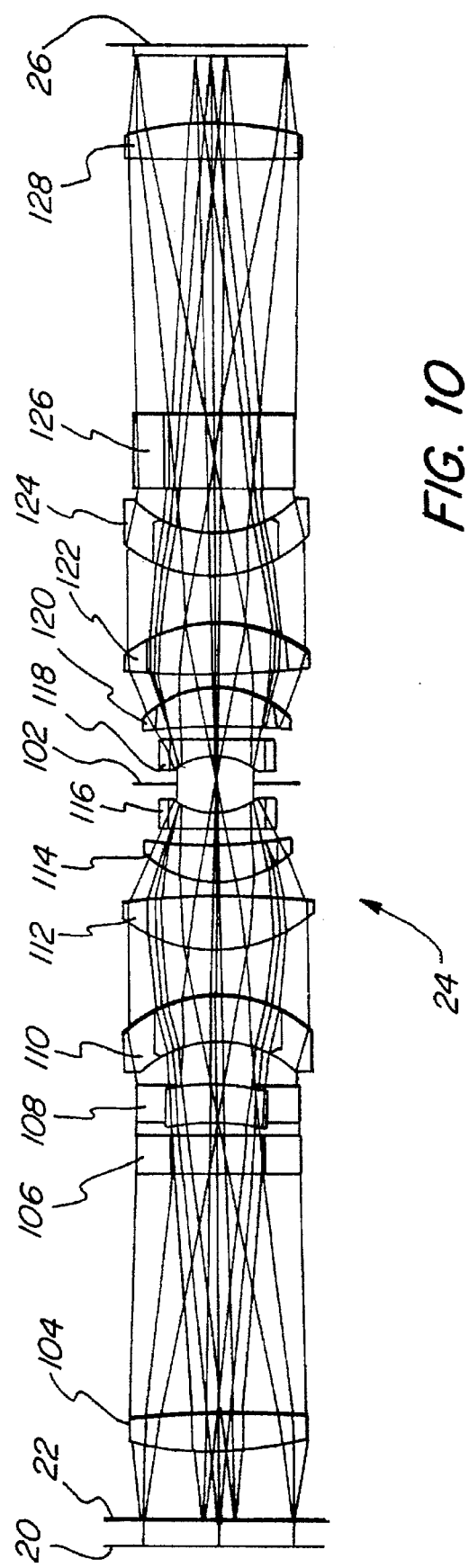
FIG. 10 is a schematic illustration of a relay.

FIG. 10 illustrates an embodiment of a 1× relay 24. The relay 24, illustrated in FIG. 10, is astigmatic and conjugates the two spatially separate image planes 20 and 22 with a reticle 26. A vertical and horizontal delimiter or framing blades may be positioned at the image planes 20 and 22 respectfully. Lenses 104, 106, 108, 110, 112, 114, and 116 are positioned between the image planes 20 and 22 and the aperture stop 102. Lenses 118, 120, 122, 124, 126, and 128 are positioned between the aperture stop 102 and the reticle 26. The relay 24 is symmetric around the aperture stop 102, except for lenses 106 and 108. In this embodiment, lenses 106 and 108 are cylindrical and have an optical power along one axis, preferably in a scan direction.

FIG. 11 illustrates another embodiment of the present invention. In this embodiment, a non-beam like light illumination source 90 is used. The illumination from the non-beam like illumination source 90 is reflected by reflector 91. Lens 92, in combination with the reflector 91, helps to form an illumination beam. Reflector 91 and lens 92 are conventional beam forming optics with collimation limited by the physical size of the source. Following lens 92 is a first array 14. Following first array 14 is a first concave mirror 94. The first concave mirror 94 causes electromagnetic radiation from the illumination source 90 to be reflected to another second concave mirror 96. Together concave mirrors 94 and 96 act as a condenser. Following second concave mirror 96 is an array optical element 18. Following the array optical element 18 is the illumination plane 21. The illumination plane 21 is placed within the near field or in the Fresnel diffraction region of the array optical element 18. FIG. 12 illustrates another embodiment of the present invention. In this embodiment, only reflective optical elements are utilized. This may be appropriate for use with X-rays or in other situations where non-transmissive elements are needed to solve material efficiency problems. The electromagnetic radiation from illumination source 10 is relatively beam-like. The illumination source 10 illuminates a first diffractive optical element 14', which creates multiple secondary sources with controlled divergence. These multiple secondary sources propagate at an angle for which the first diffractive optical element 14' is blazed or made most efficient. In principle, all angles involved could be at grazing incidence. Following the diffractive optical element 14' is a mirror 98. Mirror 98 acts as a condenser. Illumination reflecting off mirror 98 is caused to be incident on a second diffractive optical element 18'. The second diffractive optical element 18' then generates the desired illumination field or pattern in the illumination plane 21. The single mirror 98 has a focus at 100. The numerical aperture between the first diffractive optical element 14' and the second diffractive optical element 18' is much smaller than the final illumination numerical aperture. This allows the condenser to be a low numerical aperture, practically paraxial, simple system. This low numerical aperture allows the uniform field to persist across the obliquely positioned second diffractive optical element 18'.

Accordingly, it should readily be appreciated that the illumination system of the present invention, in using a diffractive optical element in a near field or Fresnel diffraction region adjacent the illumination plane, results in improved illumination properties for use in photolithography. The illumination system may be applied to any type of photolithography including scanning photolithography, step and repeat photolithography, and in particular step and scan photolithography. In step and scan photolithography, a predetermined illumination intensity profile is readily achieved that provides an advantageous exposure in a scanned field. Additionally, the use of multiplexing to form secondary output beams enhances the performance of the illumination system.

Although the present invention has been illustrated with respect to several embodiments, it should be readily appreciated that those skilled in the art may make various modifications without departing from the spirit and scope of this invention.

What is claimed is:

1. An illumination system comprising:

an illumination source generating a beam of electromagnetic radiation;

a multi-image optical element receiving the beam of electromagnetic radiation from said illumination source, said multi-image optical element having a first numerical aperture; and an array optical element receiving the beam of electromagnetic radiation from said multi-image optical element and providing an emerging predetermined angular distribution of electromagnetic radiation, said array optical element having a second numerical aperture, the second numerical aperture being larger than the first numerical aperture, whereby electromagnetic radiation from said illumination source forms an illumination field for projecting an image of a reticle.

2. An illumination system as in claim 1 wherein:

said array optical element is a diffractive optical element.

3. An illumination system as in claim 1 wherein:

the predetermined angular distribution is a uniform circular illumination.

4. An illumination system as in claim 1 wherein:

the predetermined angular distribution is an annular illumination.

5. An illumination system as in claim 1 wherein:

the predetermined angular distribution is a quadrupole illumination.

6. An illumination system as in claim 1 further comprising:

a condenser placed between said multi-image optical element and said array optical element.

7. An illumination system as in claim 6 further comprising:

a beam conditioner placed between said illumination source and said multi-image optical element.

8. An illumination system as in claim 1 wherein:

said array optical element causes controlled spacial redistribution of the electromagnetic radiation.

9. An illumination system as in claim 1 wherein:

said array optical element is placed adjacent an illumination plane used to illuminate a reticle.

10. An illumination system comprising:

an illumination source generating a beam of electromagnetic radiation;

a multi-image optical element receiving the beam of electromagnetic radiation from said illumination source;

an array optical element receiving the beam of electromagnetic radiation from said multi-image optical element and providing an emerging predetermined angular distribution of electromagnetic radiation; and a condenser placed between said multi-image optical element and said array optical element, wherein a first numerical aperture formed on the entrance side of said condenser is less than a second numerical aperture formed on the emergent side of said array optical element, whereby electromagnetic radiation from said illumination source forms an illumination field for projecting an image of reticle.

11. An illumination system comprising:

an illumination source generating a beam of electromagnetic radiation;

a multi-image optical element receiving the beam of electromagnetic radiation from said illumination source;

a condenser receiving the beam of electromagnetic radiation from said multi-image optical element; and a diffractive optical element receiving the beam of electromagnetic radiation from said condenser, said diffractive optical element placed adjacent an illumination plane used to illuminate a reticle, whereby electromagnetic radiation from said illumination source forms an illumination field having predetermined angular and spacial properties.

12. An illumination system as in claim 11 further comprising:

a beam conditioner placed between said illumination source and said multi-image optical element and receiving the beam of electromagnetic radiation from said illumination source.

13. An illumination system as in claim 11 wherein:
said multi-image optical element is an array.

14. An illumination system as in claim 13 wherein:
the array is formed by a plurality of refractive lenses.

15. An illumination system as in claim 11 wherein:
said multi-image optical element is a first diffractive optical element.

16. An illumination system as in claim 15 wherein:
the first diffractive optical element is formed from a plurality of diffractive optical elements.

17. An illumination system as in claim 11 wherein:
said diffractive optical element is transmissive.

18. An illumination system comprising:

an illumination source generating a beam of electromagnetic radiation;

a multi-image optical element receiving the beam of electromagnetic radiation from said illumination source;

a condenser receiving the beam of electromagnetic radiation from said multi-image optical element;

a diffractive optical element receiving the beam of electromagnetic radiation from said condenser, whereby electromagnetic radiation from said illumination source forms an illumination field having predetermined angular and spacial properties, and wherein the illumination field is created in the near field or in the Fresnel diffraction region of said diffractive optical element.

19. An illumination system as in claim 11 wherein:
said illumination source is a laser.

20. An illumination system as in claim 11 further comprising:
a relay placed between said diffractive optical element and the desired location of the illumination field.

21. An illumination system comprising:

an illumination source generating a beam of electromagnetic radiation;

a multi-image optical element receiving the beam of electromagnetic radiation from said illumination source;

a condenser receiving the beam of electromagnetic radiation from said multi-image optical element;

a diffractive optical element receiving the beam of electromagnetic radiation from said condenser, and an astigmatic relay placed between said diffractive optical element and a desired location of an illumination field, whereby electromagnetic radiation from said illumination source forms the illumination field having predetermined angular and spacial properties.

22. An illumination system as in claim 11 wherein: said condenser is anamorphic.

23. An illumination system comprising:

an illumination source generating a beam of electromagnetic radiation;

a multi-image optical element receiving the beam of electromagnetic radiation from said illumination source;

a condenser receiving the beam of electromagnetic radiation from said multi-image optical element;

a diffractive optical element receiving the beam of electromagnetic radiation from said condenser, and a beam expander placed between said illumination source and said multi-image optical element and receiving the beam of electromagnetic radiation from said illumination source, whereby electromagnetic radiation from said illumination source forms an illumination field having predetermined angular and spacial properties.

24. An illumination system comprising:

an illumination source generating a beam of electromagnetic radiation;

a multi-image optical element receiving the beam of electromagnetic radiation from said illumination source;

a condenser receiving the beam of electromagnetic radiation from said multi-image optical element;

a diffractive optical element receiving the beam of electromagnetic radiation from said condenser; and a beam multiplexer placed between said illumination source and said multi-image optical element and receiving the beam of electromagnetic radiation from said illumination source, whereby electromagnetic radiation from said illumination source forms an illumination field having predetermined angular and spacial properties.

25. An illumination system as in claim 24 wherein said beam multiplexer comprises:

a first plane surface;

a second plane surface, said second plane surface separated from said first plane surface;

a reflective surface formed on said first plane surface;

a plurality of partially reflective surfaces formed on said second plane surface, each of said plurality of partially reflective surfaces having a different reflectance.

26. An illumination system as in claim 25 wherein:
said beam multiplexer is formed from a single block of material.

27. An illumination system comprising:

an illumination source generating a beam of electromagnetic radiation;

a multi-image optical element receiving the beam of electromagnetic radiation from said illumination source;

a condenser receiving the beam of electromagnetic radiation from said multi-image optical element; and a diffractive optical element receiving the beam of electromagnetic radiation from said condenser, said condenser having an entrance numerical aperture, and said diffractive optical element having an exit numerical aperture, the exit numerical aperture being larger than the entrance numerical aperture, whereby electromagnetic radiation from said illumination source forms an illumination field having predetermined angular and spacial properties.

28. An illumination system comprising:

an illumination source generating a beam of electromagnetic radiation;

a multi-image optical element receiving the beam of electromagnetic radiation from said illumination source;

a condenser receiving the beam of electromagnetic radiation from said multi-image optical element; and a refractive array optical element receiving the beam of electromagnetic radiation from said condenser, said refractive array optical element placed adjacent an illumination plane, whereby electromagnetic radiation from said illumination source forms an illumination field having predetermined angular and spatial properties.

29. An illumination system as in claim 28 further comprising:

a beam conditioner placed between said illumination source and said multi-image optical element and receiving the beam of electromagnetic radiation from said illumination source.

30. An illumination system as in claim 28 wherein:
said multi-image optical element is an array.

31. An illumination system as in claim 28 wherein:
said multi-image optical element is a diffractive optical element.

32. An illumination system as in claim 31 wherein:
the diffractive optical element is formed from a plurality of diffractive optical elements.

33. An illumination system as in claim 28 wherein:
said illumination source is a laser.

34. An illumination system as in claim 28 further comprising:

a relay placed between said refractive array optical element and the desired location of the illumination field.

35. An illumination system comprising:

an illumination source generating a beam of electromagnetic radiation;

a multi-image optical element receiving the beam of electromagnetic radiation from said illumination source;

a condenser receiving the beam of electromagnetic radiation from said multi-image optical element;

a refractive array optical element receiving the beam of electromagnetic radiation from said condenser; and an astigmatic relay placed between said refractive array optical element and a desired location of an illumination field, whereby electromagnetic radiation from said illumination source forms the illumination field having predetermined angular and spatial properties.

36. An illumination system as in claim 35 wherein:
said condenser is anamorphic.

37. An illumination system comprising:

an illumination source generating a beam of electromagnetic radiation;

a multi-image optical element receiving the beam of electromagnetic radiation from said illumination source;

a condenser receiving the beam of electromagnetic radiation from said multi-image optical element;

a refractive array optical element receiving the beam of electromagnetic radiation from said condenser; and a beam expander placed between said illumination source and said multi-image optical element and receiving the beam of electromagnetic radiation from said illumination source, whereby electromagnetic radiation from said illumination source forms an illumination field having predetermined angular and spatial properties.

38. An illumination system comprising:

an illumination source generating a beam of electromagnetic radiation;

a multi-image optical element receiving the beam of electromagnetic radiation from said illumination source;

a condenser receiving the beam of electromagnetic radiation from said multi-image optical element;

a refractive array optical element receiving the beam of electromagnetic radiation from said condenser; and a beam multiplexer placed between said illumination source and said multi-image optical element and receiving the beam of electromagnetic radiation from said illumination source, whereby electromagnetic radiation from said illumination source forms an illumination field having predetermined angular and spatial properties.

39. An illumination system as in claim 38 wherein said beam multiplexer comprises:

a first plane surface;

a second plane surface, said second plane surface separated from said first plane surface;

a reflective surface formed on said first plane surface;

a plurality of partially reflective surfaces formed on said second plane surface, each of said plurality of partially reflective surfaces having a different reflectance.

40. An illumination system as in claim 39 wherein:
said beam multiplexer is formed from a single block of material.

41. An illumination system comprising:

an illumination source generating a beam of electromagnetic radiation;

a multi-image optical element receiving the beam of electromagnetic radiation from said illumination source;

a condenser receiving the beam of electromagnetic radiation from said multi-image optical element; and a refractive array optical element receiving the beam of electromagnetic radiation from said condenser, said condenser having an entrance numerical aperture, and said refractive array optical element having an exit numerical aperture, the exit numerical aperture being larger than the entrance numerical aperture, whereby electromagnetic radiation from said illumination source forms an illumination field having predetermined angular and spatial properties.

42. An illumination system comprising:

an illumination source;

beam forming optics following said illumination source;

a multi-image optical element following said beam forming optics, said multi-image optical element having a first numerical aperture;

a first concave mirror following said multi-image optical element;

a second concave mirror following said first concave mirror; and a diffractive optical element following said second concave mirror, said diffractive element having a second numerical aperture, the second numerical aperture being larger than the first numerical aperture, whereby electromagnetic radiation from said illumination source is formed into a beam by said beam forming optics, passes through said multi-image optical element, is reflected by said first concave minor to said second concave mirror, reflected by said second concave mirror and through said diffractive optical element forming an illumination field in the near field or in the Fresnel diffraction region of said diffractive optical element at a reticle.

43. An illumination system comprising:

an illumination source;

a first diffractive optical element following said illumination source, said first diffractive optical element having a first numerical aperture;

a mirror; and a second diffractive optical element, said second diffractive element having a second numerical aperture, the second numerical aperture being larger than the first numerical aperture, whereby electromagnetic radiation from said illumination source is propagated without transmission through said first diffractive optical element to said mirror and reflected to said second diffractive optical element forming an illumination field without transmission through said second diffractive optical element.

44. An illumination system as in claim 42 wherein:

the illumination field is within the near field or in the Fresnel diffraction region of said second diffractive optical element.

45. An illumination system for projecting an image of a reticle onto a wafer as used in photolithography for the manufacture of devices comprising:

an illumination source;

a beam expander following said illumination source and positioned to receive electromagnetic radiation therefrom;

a multi-image optical element following said beam expander and positioned to receive electromagnetic radiation transmitted through said beam expander, said multi-image optical element forming a plurality of secondary sources;

a condenser following said multi-image optical element and positioned to receive electromagnetic radiation from said plurality of secondary sources, said condenser having a first and second illumination plane;

a diffractive optical element following said condenser and positioned to receive electromagnetic radiation transmitted through said condenser, said diffractive optical element having a near field diffraction region, the first and second illumination planes formed by said condenser being within the near field diffraction region of said diffractive optical element; and a relay following said diffractive optical element and positioned to receive electromagnetic radiation propagating from said diffractive optical element, said relay conjugating the first and second illumination planes to a reticle plane, whereby the image of the reticle is projected through projection optics onto a photosensitive resist covered wafer.

46. An illumination system as in claim 45 wherein:

the first and second illumination planes are spatially separate.

47. An illumination system as in claim 45 wherein:

one of the first or second illumination planes has a first axis that has a substantially trapezoidal illumination profile and the other of the first or second illumination planes has a second axis that has a substantially constant illumination profile.

* * * * *